(12) United States Patent
Blanco et al.

(10) Patent No.: US 7,107,469 B2
(45) Date of Patent: Sep. 12, 2006

(54) POWER DOWN PROCESSING ISLANDS

(75) Inventors: Rafael Blanco, Essex Junction, VT (US); John M. Cohn, Richmond, VT (US); Kenneth J. Goodnow, Essex Junction, VT (US); Douglas W. Stout, Milton, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 649 days.

(21) Appl. No.: 10/604,328

(22) Filed: Jul. 11, 2003

(65) Prior Publication Data

US 2005/0041448 A1 Feb. 24, 2005

(51) Int. Cl.
*G06F 1/32* (2006.01)
*G06F 1/26* (2006.01)

(52) U.S. Cl. .............. 713/320; 713/300; 713/320; 713/323; 713/324; 716/1; 716/7; 327/333; 327/334; 327/540; 327/524; 438/128; 438/131; 438/132

(58) Field of Classification Search .............. 713/300, 713/320, 323, 324, 330, 340; 716/1, 7; 327/333–334, 327/540, 427, 524, 539; 438/128, 131, 132
See application file for complete search history.

(56) References Cited

U.S. PATENT DOCUMENTS 5,541,985 A * 7/1996 Ishii et al. .................. 379/111

6,577,535 B1 * 6/2003 Pasternak .............. 365/185.11

OTHER PUBLICATIONS

IEEE, 0-7803-7607-2/02; Title, "Managing power and performance for system-on-chip designs using voltage islands" by John M. Cohn et al.*

* cited by examiner

*Primary Examiner*—Lynne H. Browne
*Assistant Examiner*—Nitin C. Patel
(74) *Attorney, Agent, or Firm*—Schmeiser, Olsen & Watts; Anthony Canale

(57) ABSTRACT

A structure and associated method of processing data on a semi-conductor device comprising an input island, a processing island, and an output island formed on the semiconductor device. The input island is adapted to accept a specified amount of data and enable a means for providing a first specified voltage for powering the processing island after accepting the specified amount of data. The processing island is adapted to receive and process the specified amount of data from the input island upon powering the processing island by the first specified voltage. The output island is adapted to be powered by a second specified voltage. The processing island is further adapted to transmit the processed data to the output island upon said powering by the second specified voltage. The first specified voltage is adapted to be disabled thereby removing power from processing island upon completion of transmission of the processed data to the output island.

28 Claims, 3 Drawing Sheets

US 7,107,469 B2

POWER DOWN PROCESSING ISLANDS

BACKGROUND OF INVENTION

1. Technical Field

The present invention relates to a structure and associated method to selectively control power to a processing island on a semiconductor device.

2. Related Art

A typical electronic structure requires power to function. Integrated circuits may comprise a plurality of electronic structures and therefore may require a large amount of power to function. Providing a large amount of power is costly and inefficient. Therefore there exists a need to reduce power consumption by integrated circuits comprising a plurality of electronic structures.

SUMMARY OF INVENTION

The present invention provides a semiconductor device comprising:

at least one structure, each said structure comprising an input island, a processing island, and an output island formed within the semiconductor device, wherein the in-put island is adapted to accept a specified amount of data, wherein the input island is further adapted to enable a means for providing a first specified voltage for powering the processing island after accepting the specified amount of data, wherein the processing island is adapted to receive and process the specified amount of data from the input island upon said powering by the first specified voltage, wherein the output island is adapted to be powered by a second specified voltage, wherein the processing island is further adapted to transmit the processed data to the output island upon said powering by the second specified voltage, and wherein the first specified voltage is adapted to be disabled thereby removing power from processing island upon completion of transmission of the processed data to the output island.

The present invention provides a semiconductor device comprising:

a plurality of memory islands, a plurality of processing islands, and a control island formed within the semiconductor device, wherein each of said memory islands are adapted to accept a specified amount of data, wherein each of said processing islands are adapted to receive and process the specified amount of data from each of said memory islands, wherein each of said memory islands are further adapted to accept the processed data from each of said processing islands, wherein the control island is adapted to supervise and control data transfer between said memory islands and said processing islands, wherein the control island comprises means for enabling and disabling a plurality of voltages for powering each of said memory islands and each of said processing islands.

The present invention provides a method comprising:

providing a structure comprising an input island, a processing island, and an output island formed within a semiconductor device;

collecting by the input island a specified amount of data;

enabling by the input island means for providing a first specified voltage for powering the processing island after collecting the specified amount of data;

receiving by the processing island the specified amount of data from the input island upon said powering by the first specified voltage;

processing by the processing island the specified amount of data from the input island;

powering by a second specified voltage the output island;

transmitting by the processing island the processed data to the output island upon said powering by the second specified voltage; and disabling the first specified voltage thereby removing power from processing island upon completion of transmission of the processed data to the output island.

The present invention provides a method comprising:

providing a plurality of memory islands, a plurality of processing islands, and a control island formed within a semiconductor device;

collecting by each of said memory islands an individually specified amount of data;

receiving and processing by each of said processing islands the individually specified amount of data from each of said corresponding memory islands;

collecting by each of said memory islands the processed data from each of said corresponding processing islands;

controlling and supervising by the control island data transfer between each of said memory islands and each of said processing islands;

enabling and disabling by the control island a plurality of voltages for powering each of said memory islands and each of said processing islands.

DETAILED DESCRIPTION

Figure 1:
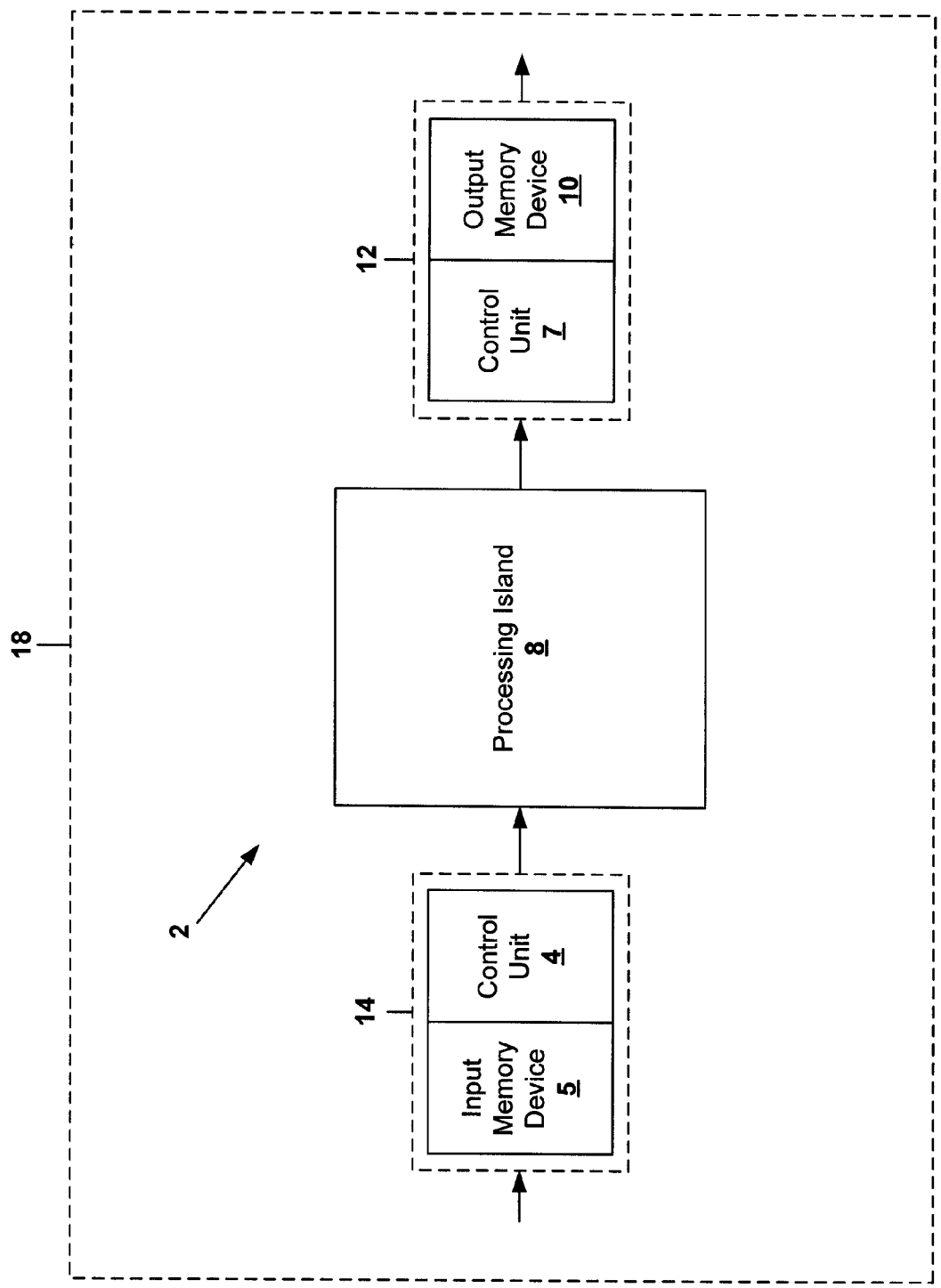
FIG. 1 illustrates a block diagram view of a semiconductor device comprising an input island, a processing island, and an output island in accordance with embodiments of the present invention.

FIG. 1 illustrates a block diagram view of a semiconductor device 18 comprising a structure 2 that comprises an in-put island 14, a processing island 8, and an output island 12 in accordance with embodiments of the present invention. The input island 14, the processing island 8, and the output island 12 are each on their own island comprising their own individual supply voltage for powering each island. Alternatively, the input island 14 and the output island 12 may be on the same island comprising the same supply voltage. The input island 14 is adapted to accept a specified amount of data from an external device (i.e., another semiconductor device, etc) or another structure within the semiconductor device (e.g., see semiconductor device 20 in FIG. 2 as discussed, infra). The input island 14 may comprise a memory device 5 and a control device 4. The memory device 5 is used to temporarily store the specified amount of data. The memory device 5 may be any memory device known to a person of ordinary skill in the art including, inter alia, random access memory (RAM), a buffer, etc. The memory device 5 may comprise, inter alia, a first in-first out (FIFO) data structure, a last in-first out (LIFO) data structure, etc. The control device 4 enables a first means for providing a first specified supply voltage for powering the processing island 8 after accepting the specified amount of data. The means for providing the first specified supply voltage may be a switching means. The switching means may be any switching means known to a person of ordinary skill in the art including, inter alia, a mosfet, a transistor, a relay, etc. The processing island 8 is adapted to receive and process the specified amount of data from the input island 14 upon said powering by the first specified supply voltage. Upon completion of said processing by the processing island 8, the control device 4 enables a second means for providing a second specified supply voltage for powering the output island 12. The processing island 8 is further adapted to transmit the processed data to the output island 12 upon said powering by the second specified supply voltage. Said first means disables the first specified supply voltage thereby removing power from processing island 8 upon completion of transmission of the processed data to the output island 12. The output island 12 may comprise a memory device 10. The memory device 10 may be equivalent to the memory device 5. The output island 12 may transmit the processed data to an external output device such as, inter alia, another semiconductor device, a video monitor, an audio amplifier, a printer, etc. Alternatively, the output island 12 may transmit the processed data to another structure on the semiconductor 18 (e.g., see semiconductor 20 in FIG. 3 as discussed, infra) for further processing. Once the output island 12 transmits all of the processed data, said second means may be disabled thereby removing power from the output island 12. Said second means may be disabled by the control device 12 or alternatively said second means may be disabled by a control device 7 within the output island 12. The first input island 14 may be powered by a third specified supply voltage and the third specified supply voltage may be disabled when the first input island 14 is not in use. As an alternative, the input island 14 may pass data directly to the output island 12 thereby bypassing the processing island 8. The first specified supply voltage, the second specified supply voltage, and the third specified supply voltage may not be equivalent to each other. Processing data may include, inter alia, compression, decompression, performing calculations, decoding, encoding, arranging, prioritizing, etc. As discussed supra, the memory device 5 and the memory device 10 may arrange data for transfer as FIFO or LIFO. Alternatively, the memory device 5 and the memory device 10 may comprise a means for prioritizing data according to importance or function. The means for prioritizing data may include, inter alia, the use of tag bits to flag important data, etc. The data may alternatively bypass the input memory device 5 so that the data may be transmitted directly to the processing island 8 for immediate processing. In summary, the input island 14, the processing island 8, and the output island 12 are each only powered on while performing a function thereby lowering a total power consumption by the semiconductor device 18.

Figure 2:
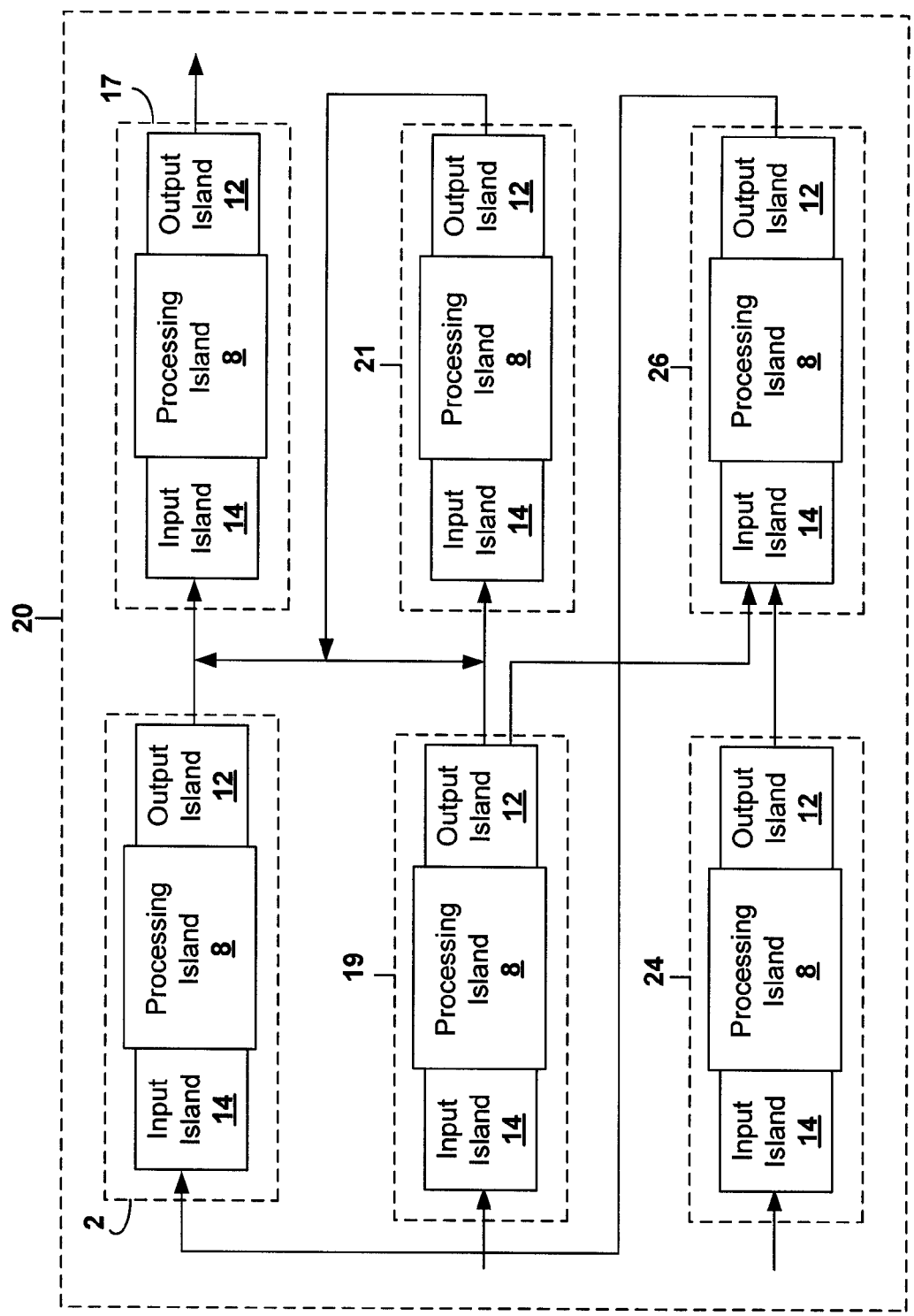
FIG. 2 illustrates an alternative embodiment of FIG. 1 showing a block diagram view of a semiconductor device comprising a plurality of structures in accordance with embodiments of the present invention.

FIG. 2 illustrates an alternative embodiment of FIG. 1 showing a block diagram view of a semiconductor device 20 comprising a plurality of structures 2, 17, 19, 21, 24, and 26 each comprising an input island 14, a processing island 8, and an output island 12 in accordance with embodiments of the present invention. In contrast with FIG. 1, the semiconductor device 20 comprises the plurality of structures 2, 17, 19, 21, 24, and 26. The plurality of structures 2, 17, 19, 21, 24, and 26 are in various configurations for communicating and transferring data between each other. Please note that the configuration of FIG. 2 is shown for illustrative purposes only and that various other configurations may be used. A first specified amount of data may be inputted into structure 19 for processing (see description of FIG. 1). The data may be transmitted from structure 19 to structure 21 for further processing. The data may be looped a plurality of times through structure 21 for further processing. Upon completion of processing by the structure 21, the data may be transmitted to structure 17 for a final processing step. The completely processed data may be transmitted from structure 17 to an external output device such as, inter alia, another semiconductor device, a video monitor, an audio amplifier, a printer, etc. Alternatively, the data processed by structure 19 may be transmitted to structure 26 (i.e., instead of structure 21 as discussed supra) for further processing. The data is processed by structure 26 and transmitted to structure 2. The data is then processed by structure 2 and transmitted to structure 17 for final processing. The completely processed data is transmitted from structure 17 to an external output device as discussed supra. A second specified amount of data may be inputted into structure 24 for processing (see description of FIG. 1). The data is transmitted from structure 24 to structure 26 for further processing. Structure 26 transmits the data to structure 2 for processing and structure 2 transmits the data to structure 17 for final processing. The completely processed data is transmitted from structure 17 to an external output device as discussed supra. All of the structures 2, 17, 19, 21, 24, and 26 comprise the same functionality as structure 2 as described in FIG. 1 supra. Each of said structures 2, 17, 19, 21, 24, and 26 may function independently or each of said structures 2, 17, 19, 21, 24, and 26 may perform together as a group.

Figure 3:
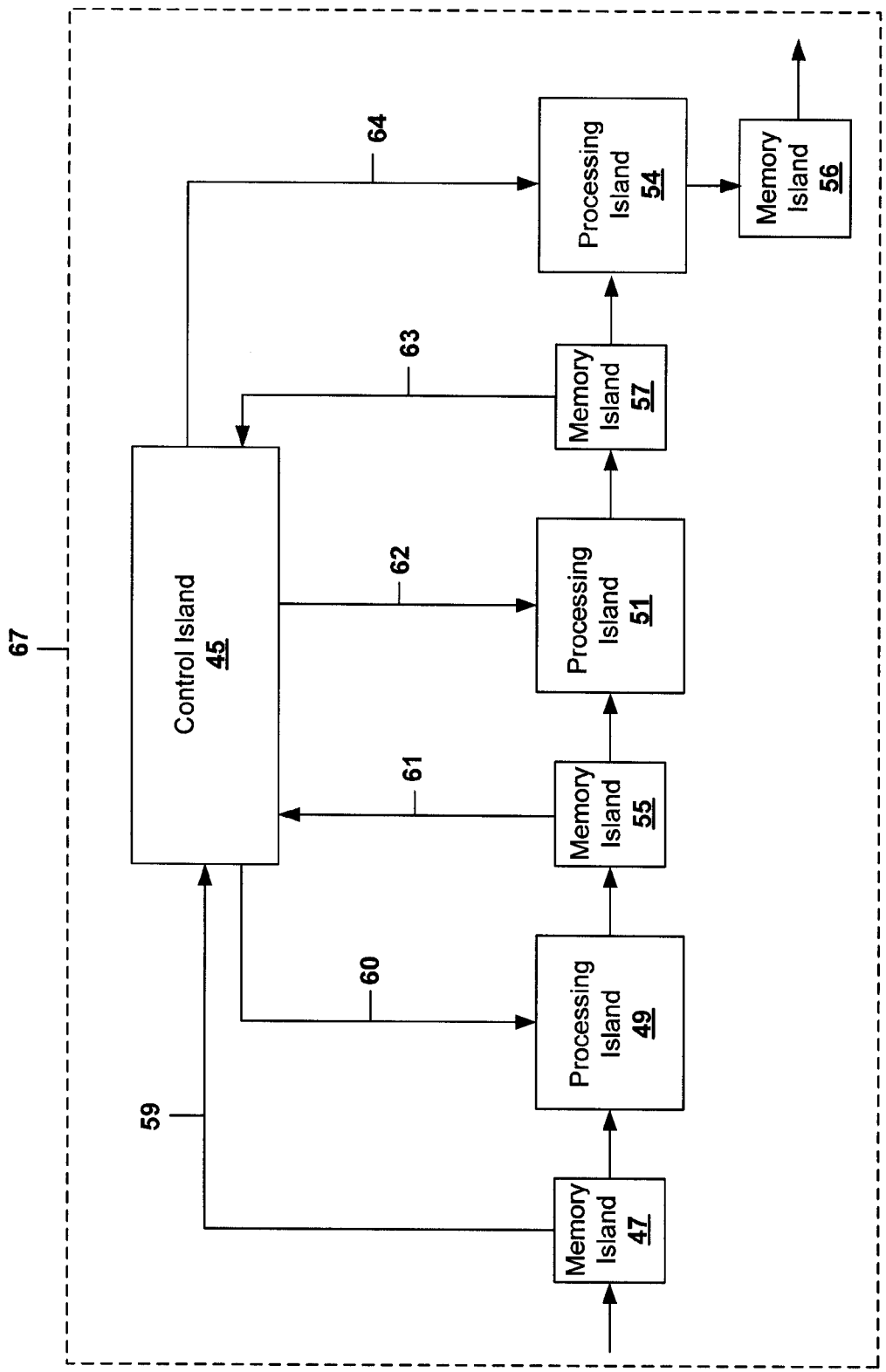
FIG. 3 illustrates an alternative embodiment of FIGS. 1 and 2 showing a block diagram view of a semiconductor device comprising an individual control island in accordance with embodiments of the present invention.

FIG. 3 illustrates an alternative embodiment of FIGS. 1 and 2 showing a block diagram view of a semiconductor device 67 comprising, an individual control island 45, a plurality of processing islands 49, 51, and 54, and a plurality of memory islands 47, 55, and 57 each comprising a memory device in accordance with embodiments of the present invention. In contrast to FIGS. 1 and 2, the semiconductor device 67 comprises one central control island 45 to control data flow. Additionally, the central control island 45 controls and enabling and disabling the means for providing the specified supply voltage for the processing islands 49, 51, and 54 and the memory islands 47, 55, and 57. The memory islands 47, 55, and 57 each may comprise a memory device that may function as an input memory device or an output memory device. Each of memory islands 47, 55, and 57 comprise a corresponding link 59, 61, and, 63 to the control unit 45 to communicate to the control unit 45 as to when data is ready for processing. When the memory island 47 communicates to the control unit 45 that data is ready for processing, the control unit 45 unit enables a means for providing a specified supply voltage for powering the processing island 49. After the data is processed, the data is sent to memory island 55 to await further processing and the means for providing the specified supply voltage to the processing island 49 is disabled thereby removing power to the processing island 49. When the memory island 55 communicates to the control unit 45 that data is ready for processing, the control unit 45 unit enables a means for providing a specified supply voltage for powering the processing island 51. After the data is processed, the data is sent to memory island 57 to await further processing and the means for providing the specified supply voltage to the processing island 51 is disabled thereby removing power to the processing island 51. When the memory island 57 communicates to the control unit 45 that data is ready for processing, the control unit 45 unit enables a means for providing a specified supply voltage for powering the processing island 54. After the data is processed, the data is sent to memory island 56 to await output to an external output device such as, inter alia, another semiconductor device, a video monitor, an audio amplifier, a printer, etc. and the means for providing the specified supply voltage to the processing island 54 is disabled thereby removing power to the processing island 54. Please note that the configuration of FIG. 3 is shown for illustrative purposes only and that various other configurations and combinations may be used.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor device, comprising:
   at least one structure, each said structure comprising an input island, a processing island, and an output island formed within the semiconductor device, said input island is adapted to accept a specified amount of data, said input island is further adapted to enable a means for providing a first specified voltage for powering the processing island after accepting the specified amount of data, said processing island is adapted to receive and process the specified amount of data from the input island upon said powering by the first specified voltage, said output island is adapted to be powered by a second specified voltage, said processing island is further adapted to transmit the processed data to the output island upon said powering by the second specified voltage, and said first specified voltage is adapted to be disabled thereby removing power from processing island upon completion of transmission of the processed data to the output island.

2. The semiconductor device of claim 1, wherein the input island comprises a first memory device for collecting the specified amount of data and a control device for enabling and disabling the first specified voltage, controlling a flow of the specified data to the processing island, enabling and disabling the second specified voltage, and controlling the transmission of the processed data to the output island, and wherein the output island comprises a second memory device for collecting the processed data from the processing island.

3. The semiconductor device of claim 2, wherein the first memory device and the second memory device are buffers.

4. The semiconductor device of claim 2, wherein the first memory device and the second memory device are selected from the group consisting of first in-first out (FIFO) memory and last in-first out (LIFO) memory.

5. The semiconductor device of claim 1, wherein the first specified voltage is not equal to the second specified voltage.

6. The semiconductor device of claim 1, further comprising a third specified voltage for powering the input device, wherein the first specified voltage, the second specified voltage, and the third specified voltage are not equal to a same voltage.

7. The semiconductor device of claim 1, wherein the at least one structure comprises a plurality of said structures, wherein each of said structures comprise means for communicating and transferring data between each of said structures.

8. The semiconductor device of claim 1, further comprising means for prioritizing the specified amount of data in the input island for a specified order of transmission to the processing island.

9. A semiconductor device, comprising:
   a plurality of memory islands, a plurality of processing islands, and a control island formed within the semiconductor device, said memory islands are adapted to accept a specified amount of data, said processing islands are adapted to receive and process the specified amount of data from each of said memory islands, said memory islands are further adapted to accept the processed data from each of said processing islands, said control island is adapted to supervise and control data transfer between said memory islands and said processing islands, said control island comprises means for enabling and disabling a plurality of voltages for powering each of said memory islands and each of said processing islands.

10. The semiconductor device of claim 9, wherein each of said of said memory islands are adapted to be powered only while performing a memory function, and wherein each of said processing islands are adapted to be powered only while performing a processing function.

11. The semiconductor device of claim 9, each of the plurality of voltages are not a same voltage.

12. The semiconductor device of claim 9, wherein the plurality of memory islands are buffers.

13. The semiconductor device of claim 9, wherein the plurality of memory islands are selected from the group consisting of first in-first out (FIFO) memory and last in-first out (LIFO) memory.

14. The semiconductor device of claim 9, further comprising means for prioritizing the specified amount of data in each of the plurality of memory islands for a specified order of transmission to each of the processing islands.

15. A method, comprising:
   providing a structure comprising an input island, a processing island, and an output island formed within a semiconductor device;
   collecting by the input island a specified amount of data;
   enabling by the input island means for providing a first specified voltage for powering the processing island after collecting the specified amount of data;
   receiving by the processing island the specified amount of data from the input island upon said powering by the first specified voltage;
   processing by the processing island the specified amount of data from the input island;
   powering by a second specified voltage the output island;
   transmitting by the processing island the processed data to the output island upon said powering by the second specified voltage; and
   disabling the first specified voltage thereby removing power from processing island upon completion of transmission of the processed data to the output island.

16. The method of claim 15, wherein the input island comprises a first memory device and a control device, wherein the output island comprises a second memory device, and wherein the method further comprises;
   collecting by the first memory device the specified amount of data;
   enabling by the control device the means for providing the first specified voltage for powering the processing island after collecting the specified amount of data;
   controlling by the control device a flow of the specified data to the processing island;
   processing by the processing island the specified amount of data from the input island;
   enabling by the control device the second specified voltage for powering the second memory device;

controlling, by the control device the transmission of the processed data to the second memory device;

disabling by the control device the means for providing the first specified voltage for powering the processing device upon completion of said transmitting of the processed data to the output islands.

17. The method of claim 16, wherein the first memory device and the second memory device are buffers.

18. The method of claim 16, wherein the first memory device and the second memory device are selected from the group consisting of first in-first out (FIFO) memory and last in-first out (LIFO) memory.

19. The method of claim 15, wherein the first specified voltage is not equal to the second specified voltage.

20. The method of claim 15, further comprising powering by a third specified voltage the input device, wherein the first specified voltage, the second specified voltage, and the third specified voltage are not equal to a same voltage.

21. The of method claim 15, further comprising a plurality of said structures, wherein each of said structures comprise means for communicating and transferring data among said structures.

22. The method of claim 15, further comprising prioritizing the specified amount of data in the input island for a specified order of transmission to the processing island.

23. A method, comprising:
providing a plurality of memory islands, a plurality of processing islands, and a control island formed within a semiconductor device;
collecting by each of said memory islands an individually specified amount of data;
receiving and processing by each of said processing islands the individually specified amount of data from each of said corresponding memory islands;
collecting by each of said memory islands the processed data from each of said corresponding processing islands;
controlling and supervising by the control island data transfer between each of said memory islands and each of said processing islands;
enabling and disabling by the control island a plurality of voltages for powering each of said memory islands and each of said processing islands.

24. The method of claim 23, further comprising powering each of said memory islands and each of said processing islands only while performing a function.

25. The method of claim 23, wherein each of the plurality of voltages are not equal to each other.

26. The method of claim 23, wherein the plurality of memory islands are buffers.

27. The method of claim 23, wherein the plurality of memory islands are selected from the group consisting of first in-first out (FIFO) memory and last in-first out (LIFO) memory.

28. The method of claim 23, further comprising prioritizing the specified amount of data in each of the plurality of memory islands for a specified order of transmission to each of the corresponding processing islands.

* * * * *

UNITED STATES PATENT AND TRADEMARK OFFICE
CERTIFICATE OF CORRECTION

PATENT NO. : 7,107,469 B2 Page 1 of 1
APPLICATION NO. : 10/604328
DATED : September 12, 2006
INVENTOR(S) : Blanco et al.

It is certified that error appears in the above-identified patent and that said Letters Patent is hereby corrected as shown below:

Column 7
Line 19, delete "of method" and insert -- method of --

Signed and Sealed this

Nineteenth Day of December, 2006

JON W. DUDAS
*Director of the United States Patent and Trademark Office*